(12) United States Patent
Lee et al.

(10) Patent No.: US 12,034,061 B2
(45) Date of Patent: *Jul. 9, 2024

(54) METHOD FOR FORMING SEMICONDUCTOR STRUCTURE

(71) Applicant: Taiwan Semiconductor Manufacturing Company, Ltd., Hsinchu (TW)

(72) Inventors: Chien-Wei Lee, Kaohsiung (TW); Yen-Ru Lee, Hsinchu (TW); Hsueh-Chang Sung, Zhubei (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 115 days.

This patent is subject to a terminal disclaimer.

(21) Appl. No.: 17/688,236

(22) Filed: Mar. 7, 2022

(65) Prior Publication Data

US 2022/0190139 A1    Jun. 16, 2022

Related U.S. Application Data

(63) Continuation of application No. 16/837,465, filed on Apr. 1, 2020, now Pat. No. 11,271,096.

(51) Int. Cl.
*H01L 29/66* (2006.01)
*H01L 21/02* (2006.01)
*H01L 29/78* (2006.01)

(52) U.S. Cl.
CPC .... *H01L 29/6681* (2013.01); *H01L 21/02054* (2013.01); *H01L 29/6653* (2013.01); *H01L 29/6656* (2013.01); *H01L 29/7848* (2013.01)

(58) Field of Classification Search
CPC ............. H01L 29/6681; H01L 29/6653; H01L 29/6656; H01L 21/02054
See application file for complete search history.

(56) References Cited

U.S. PATENT DOCUMENTS

| | | | |
|---|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |

(Continued)

*Primary Examiner* — Christine A Enad
(74) *Attorney, Agent, or Firm* — Birch, Stewart, Kolasch & Birch, LLP

(57) ABSTRACT

A method for forming a semiconductor structure includes forming a gate structure over a substrate. The method also includes forming a spacer on a sidewall of the gate structure. The method also includes forming a source/drain recess beside the spacer. The method also includes treating the source/drain recess and partially removing the spacers in a first cleaning process. The method also includes treating the source/drain recess with a plasma process after performing the first cleaning process. The method also includes treating the source/drain recess in a second cleaning process after treating the source/drain recess with the plasma process. The method also includes forming a source/drain structure in the source/drain recess after performing the second cleaning process.

20 Claims, 12 Drawing Sheets

(56) References Cited

U.S. PATENT DOCUMENTS

| | | |
|---|---|---|
| 9,245,805 B2 | 1/2016 | Yeh et al. |
| 9,520,482 B1 | 12/2016 | Chang et al. |
| 9,576,814 B2 | 2/2017 | Wu et al. |
| 9,754,827 B1 * | 9/2017 | Tsao ................. H01L 21/02068 |
| 10,867,860 B2 | 12/2020 | Kao et al. |
| 2012/0202024 A1 | 8/2012 | Self |
| 2012/0270377 A1 * | 10/2012 | Guo ................. H01L 29/66636 |
| | | 438/301 |
| 2014/0264348 A1 | 9/2014 | Tsai et al. |
| 2016/0013314 A1 | 1/2016 | Choi et al. |
| 2018/0097110 A1 * | 4/2018 | Yang ................. H01L 29/66636 |
| 2020/0013878 A1 | 1/2020 | Colombeau et al. |
| 2020/0227519 A1 * | 7/2020 | Song ................. H01L 29/66969 |

\* cited by examiner

METHOD FOR FORMING SEMICONDUCTOR STRUCTURE

CROSS-REFERENCE TO RELATED APPLICATION

This application is a Continuation Application of U.S. patent application Ser. No. 16/837,465, filed on Apr. 1, 2020, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A, 2B-1, 2B-2, 2C-2H are cross-sectional representations of various stages of forming a FinFET device structure, in accordance with some embodiments of the disclosure.

DETAILED DESCRIPTION

Figure 1:
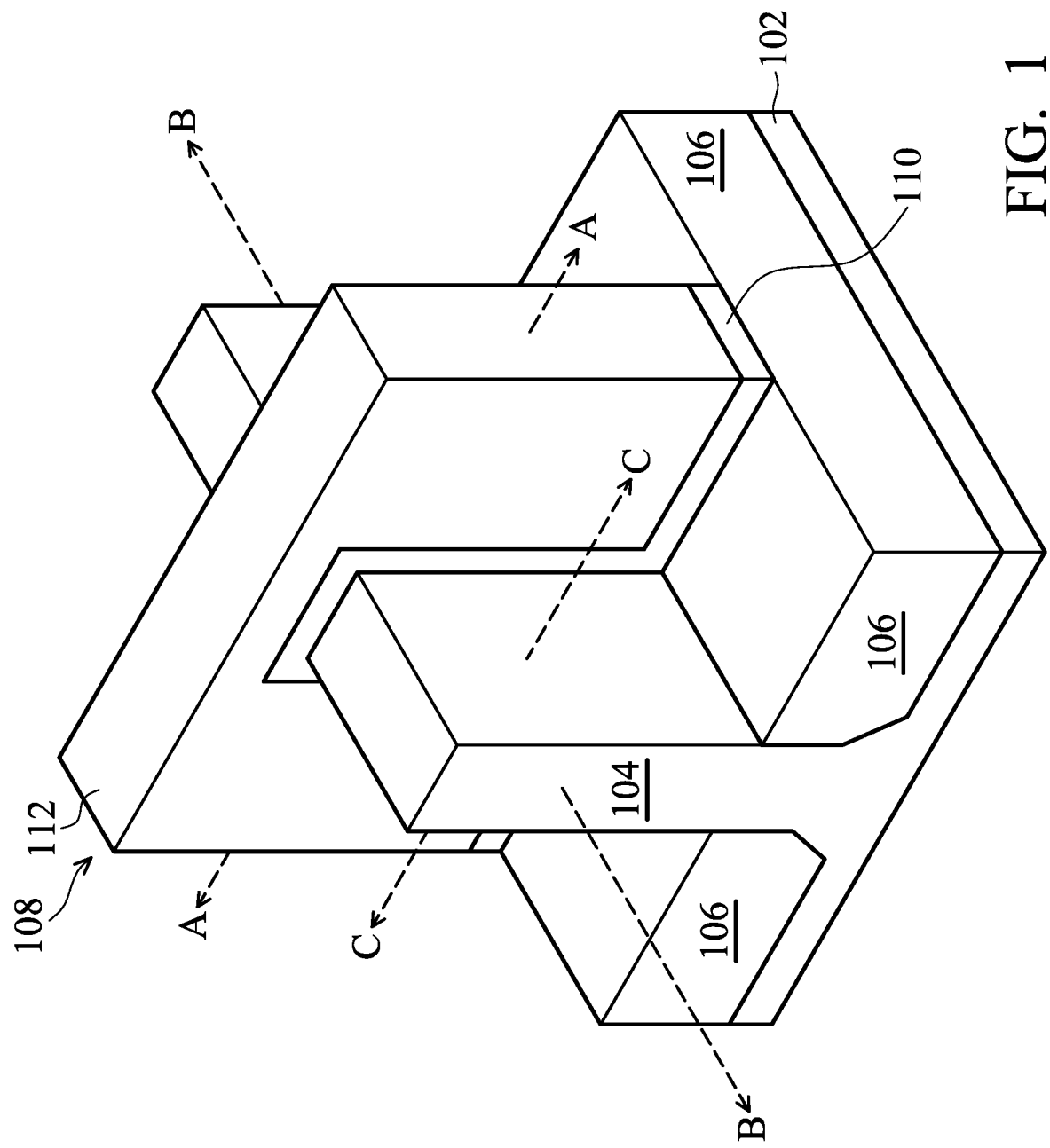
FIG. 1 is a perspective representation of a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a fin field effect transistor (FinFET) device structure are provided. The method for forming the FinFET device structure may include sequentially wet cleaning, plasma treating, and wet cleaning a source/drain recess to enlarge the width of the source/drain recess. The surface of the source/drain recess may be smoother and therefore having better surface quality and better control of its size. With better surface quality, the process window of contact landing may be enlarged. With better control of the distance between the source/drain epitaxial structure and the gate structure, the device performance may be enhanced.

Figure 2A:
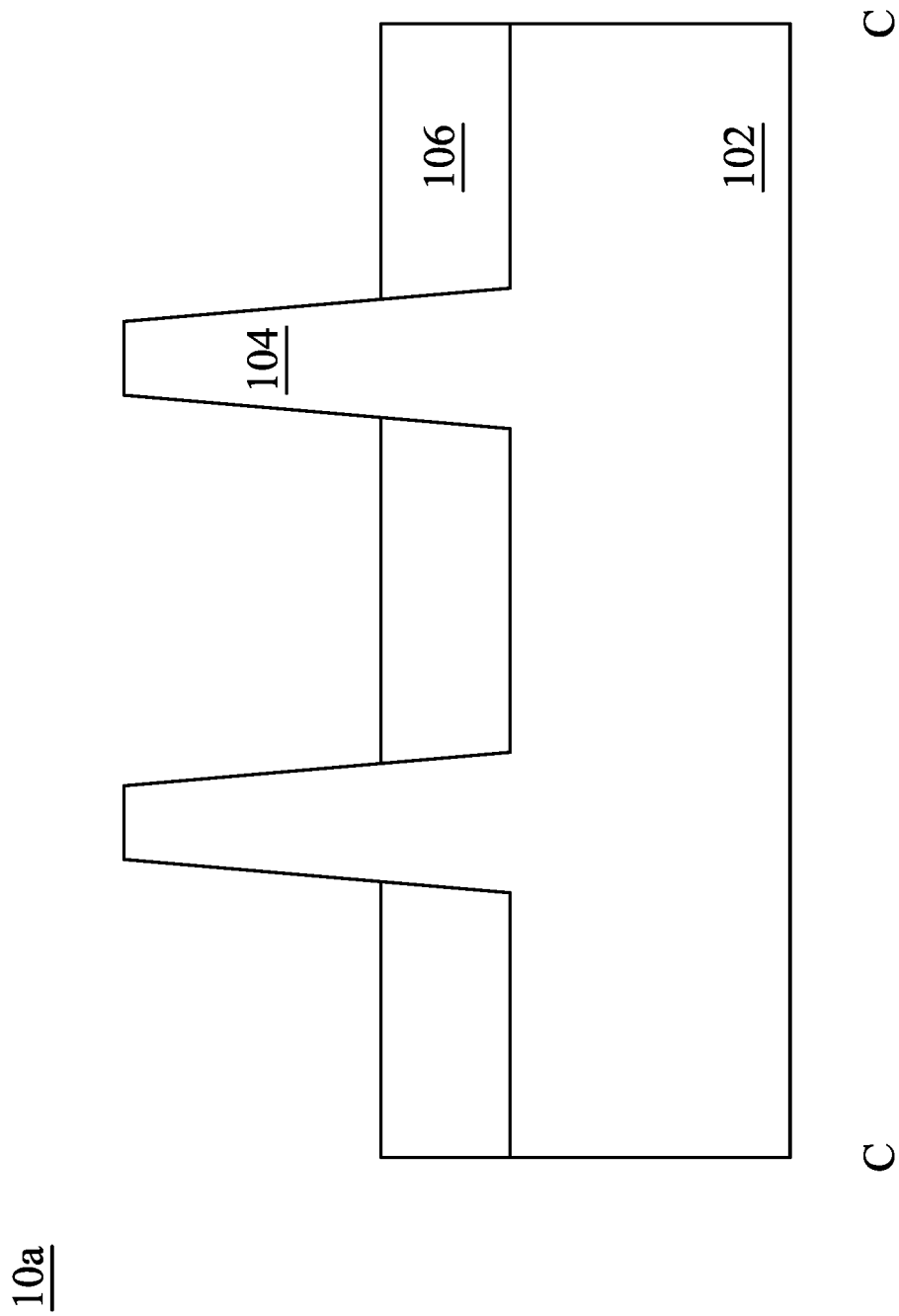
Figures 1, 2B:
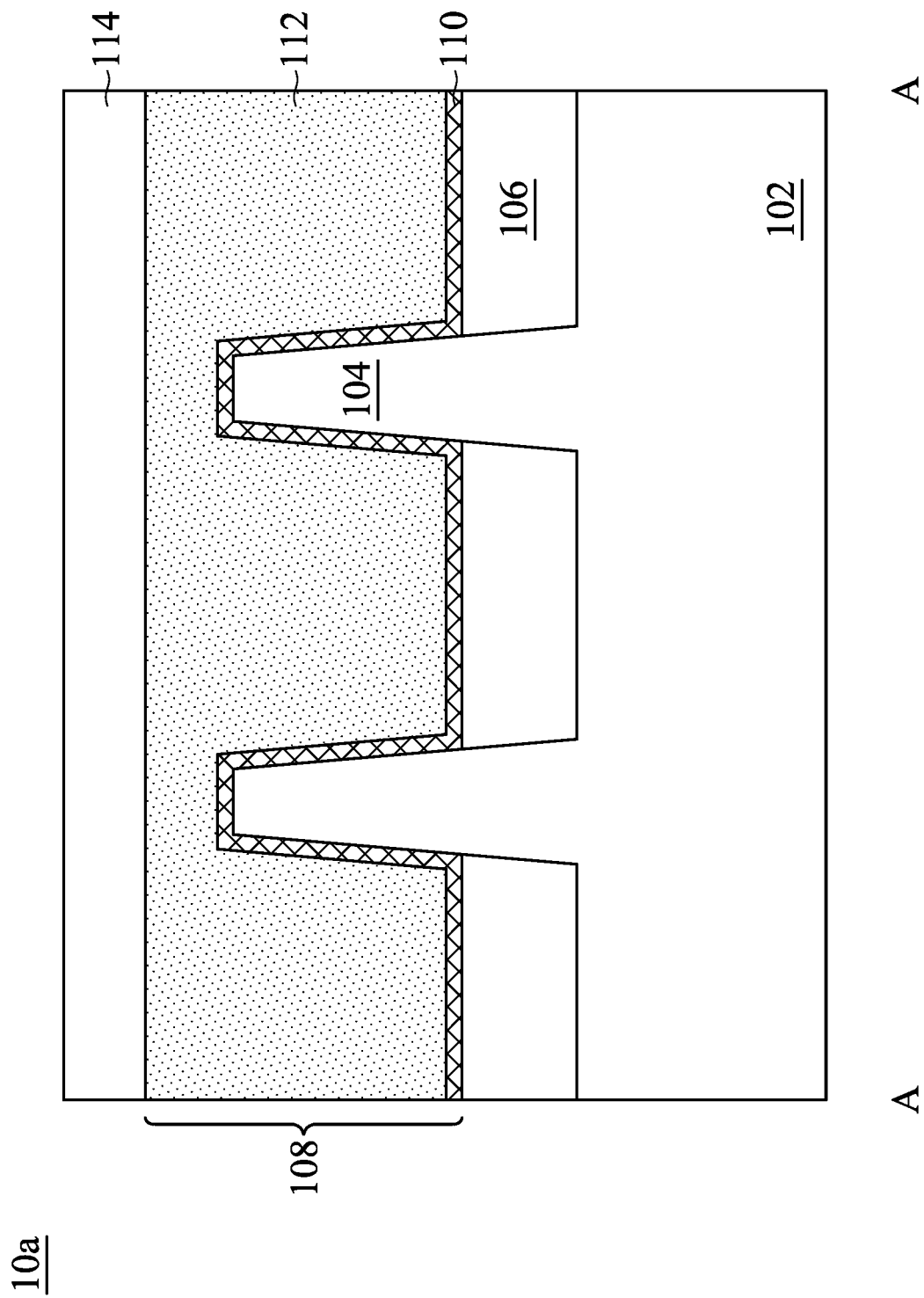
Figures 2, 2B:
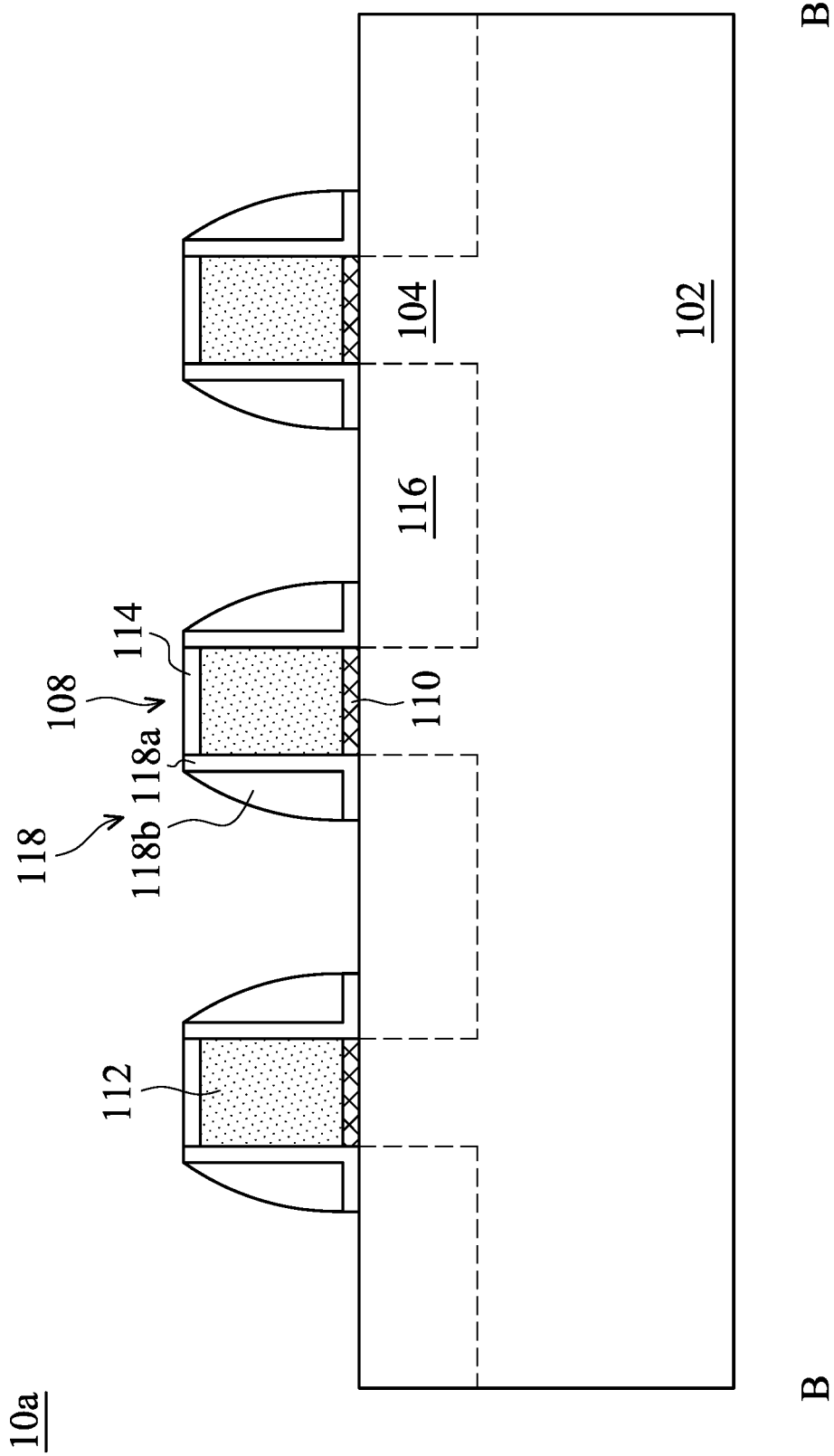
Figure 2C:
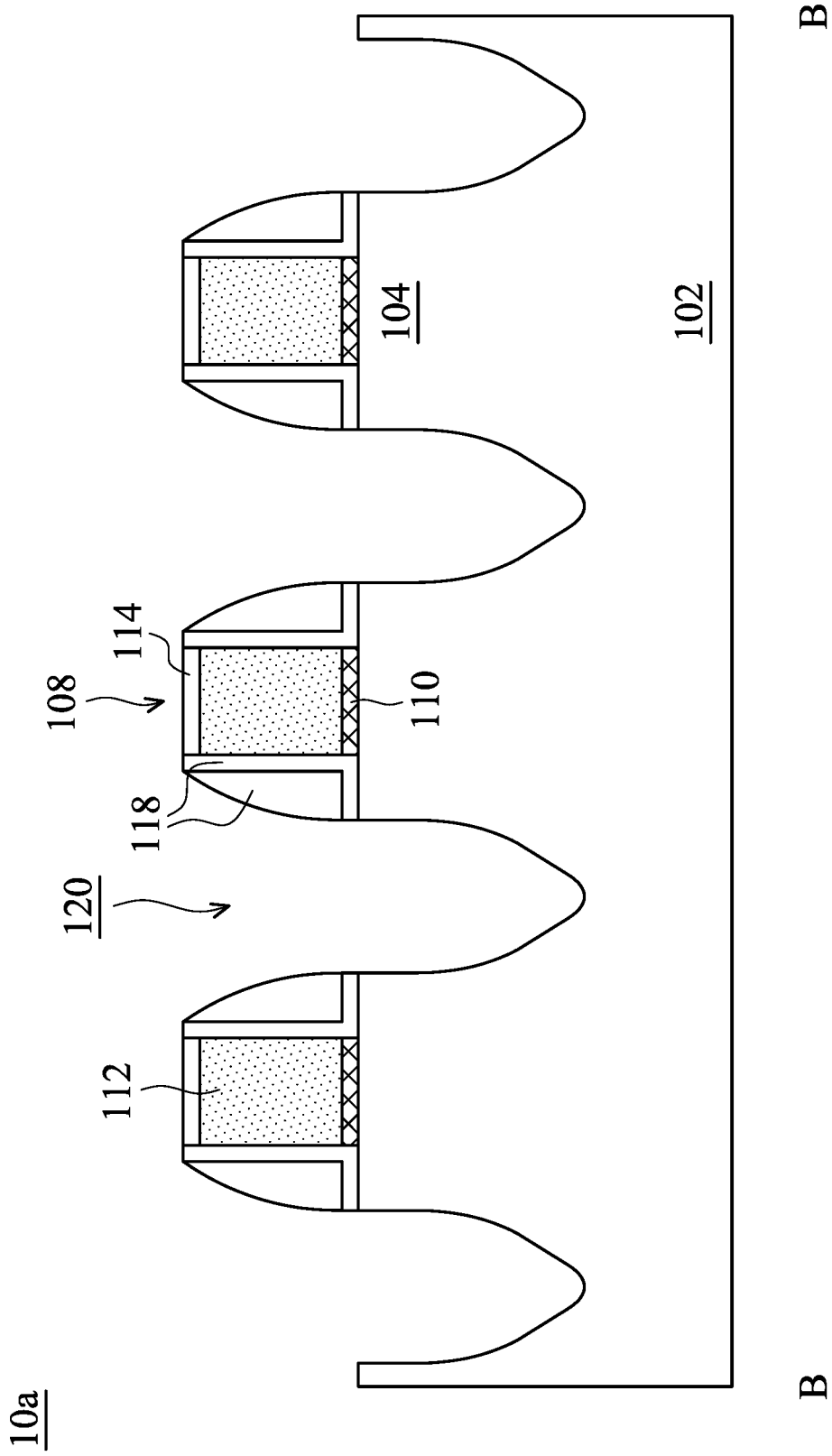

FIG. 1 is a perspective representation of a FinFET device structure 10a, in accordance with some embodiments of the disclosure. FIGS. 2A, 2B-1, 2B-2, 2C-2H are cross-sectional representations of various stages of forming the FinFET device structure 10a, in accordance with some embodiments of the disclosure. FIG. 2A shows a cross-sectional representation taken along line C-C in FIG. 1. FIG. 3 is a flow chart of forming the FinFET device structure 10a, in accordance with some embodiments of the disclosure.

Referring to FIG. 3, at step 1010, a fin structure is formed over a substrate. The substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may have an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1 and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIGS. 1 and 2A in accordance with some embodiments. The isolation layer 106 may be made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process such as low pressure CVD (LPCVD), plasma enhanced CVD (PECVD), or high density plasma CVD (HDP-CVD), high aspect ratio process (HARP), flowable CVD (FCVD), atomic layer deposition (ALD), a spin-on-glass process, or another applicable process, or a combination thereof.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1 and 2A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Referring to FIG. 3, at step 1020, a gate structure is formed across the fin structure. FIGS. 2B-1 and 2B-2 show cross-sectional representations taken along line A-A and B-B in FIG. 1, respectively. Next, a dummy gate structure 108 is formed over and across the fin structures 104, as shown in FIGS. 1, 2B-1, and 2B-2 in accordance with some embodiments. In some embodiments, the dummy gate structure 108 includes an interfacial layer (not shown), a dummy gate dielectric layer 110 and a dummy gate electrode layer 112. The dummy gate dielectric layer 110 and the dummy gate electrode layer 112 may be replaced by the following steps to form a real gate structure with a high-k dielectric layer and a metal gate electrode layer.

The interfacial layer may include silicon oxide. The silicon oxide may be formed by an oxidation process (such as a dry oxidation process, or a wet oxidation process), a deposition process (such as a chemical vapor deposition (CVD) process or an atomic layer deposition (ALD) process), other applicable processes, or a combination thereof. In some embodiments, the interfacial layer may be thermally grown using a thermal oxidation process in oxygen-containing ambient or nitrogen-containing ambient (e.g. NO or $N_2O$).

The dummy gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfSiO, LaSiO, AlSiO, (Ba, Sr)TiO$_3$, Al$_2$O$_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The dummy gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, a mask layer 114 is formed over the dummy gate structure 108, as shown in FIGS. 2B-1 and 2B-2 in accordance with some embodiments. The mask layer 114 may be formed of silicon nitride. After the mask layer 114 is formed, the mask layer 114 may be patterned by a suitable photolithography and etching process. Afterwards, an etching process may be performed on the dummy gate dielectric layer 110 and the dummy gate electrode layer 112 to form the dummy gate structure 108 by using the patterned mask layer 114 as a mask. The etching process may be a dry etching process or a wet etching process. In some embodiments, the dummy gate dielectric layer 110 and the dummy gate electrode layer 112 are etched by a dry etching process. The dry etching process may include using a fluorine-based etchant gas, such as SF$_6$, C$_x$F$_y$ (where x and y may be positive integers), NF$_3$, or a combination thereof. After the etching process, the top portion of the fin structure 104 may be exposed on the opposite sides of the dummy gate structure 108.

Afterwards, a lightly doped drain (LDD) region 116 is formed in the fin structure 104 between the gate structures 108, as shown in FIG. 2B-2 in accordance with some embodiments. The LDD region 116 may be formed by an ion implantation process. N-type or P-type dopant may be implanted in the fin structure 104 to form the LDD region 116. N-type dopants may be P, As, N, Sb ions, or a combination thereof. P-type dopant may be B, Ga, Al, In, BF$_3^+$ ions, or a combination thereof. In some embodiments, the LDD region 116 may be formed by implanting the fin structure 104 through a patterned mask (not shown) such as a patterned photoresist Next, a pair of spacers 118 are formed on opposite sidewalls of the dummy gate structure 108, as shown in FIG. 2B-2 in accordance with some embodiments. The spacers 118 may include a first spacer 118a and a second spacer 118b. As shown in FIG. 2B-2, the first spacer 118a is formed over and in direct contact with the sidewalls of the dummy gate structure 108, and the second spacer 118b is formed over the first spacer 118a. In some embodiments, the first spacer 118a is in an L-shape. The first gate spacer 118a may be formed of a nitride, such as silicon nitride, silicon oxynitride, silicon carbide, silicon carbonitride, the like, or a combination thereof, and may be formed using, e.g., a thermal oxidation, a chemical vapor deposition (CVD) process, a spin-on-glass process, or other suitable deposition processes. The second gate spacer 118b may be formed of silicon nitride, silicon carbonitride, a combination thereof, or the like using a suitable deposition method.

Afterwards, referring to FIG. 3, at step 1030, a source/drain recess is formed adjacent to the gate structure. The top portion of the fin structure 104 exposed on the opposite sides of the dummy gate structure 108 may be removed by an etching process to form a source/drain recess 120, as shown in FIG. 2C in accordance with some embodiments. The etching process may be a dry etching process or a wet etching process. The fin structures 104 may be etched by a dry etching process. The dry etching process may include using a fluorine-based etchant gas, such as SF$_6$, C$_x$F$_y$ (where x and y may be positive integers), NF$_3$, or a combination thereof.

Figure 2D:
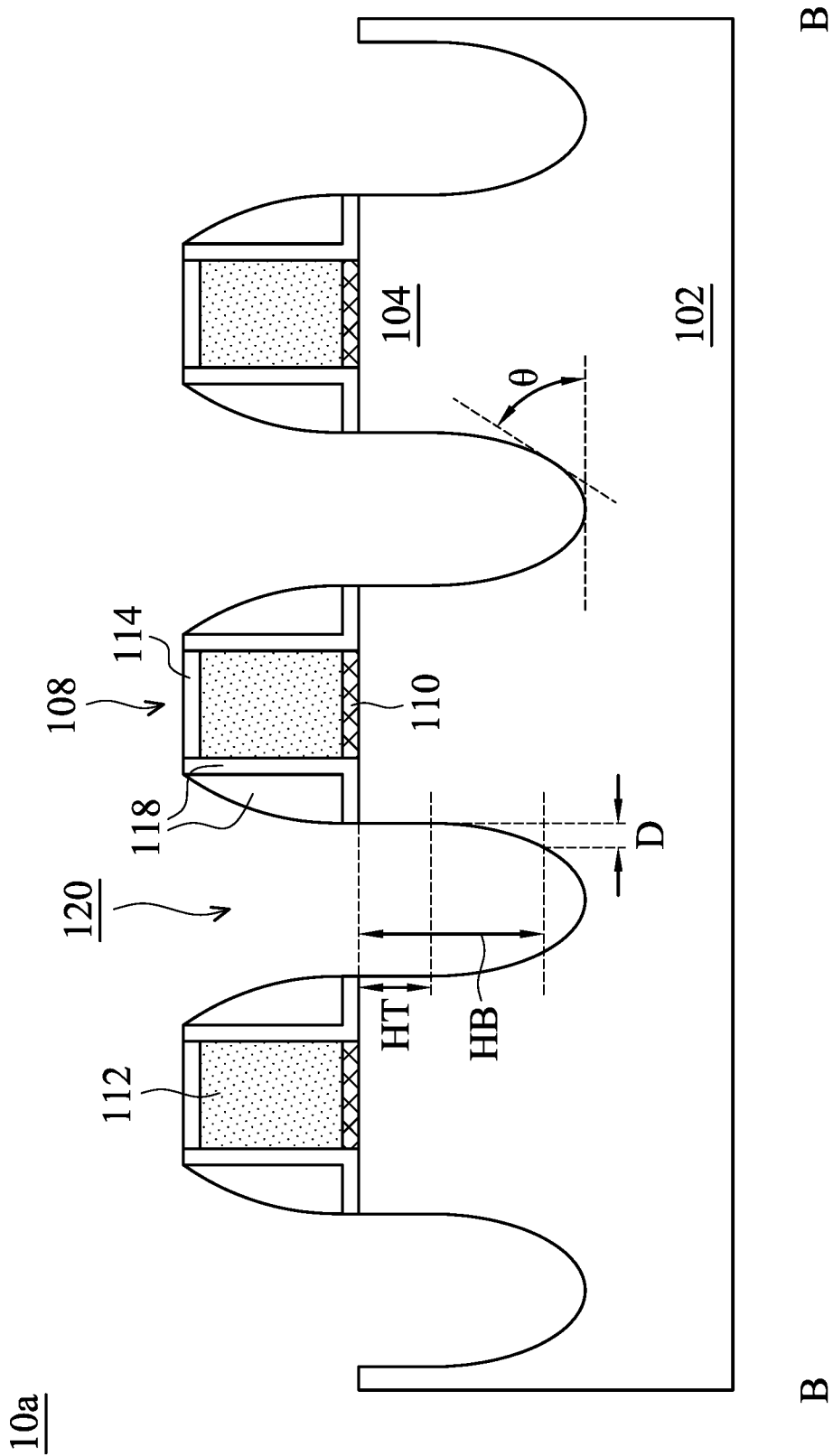
Figure 3:
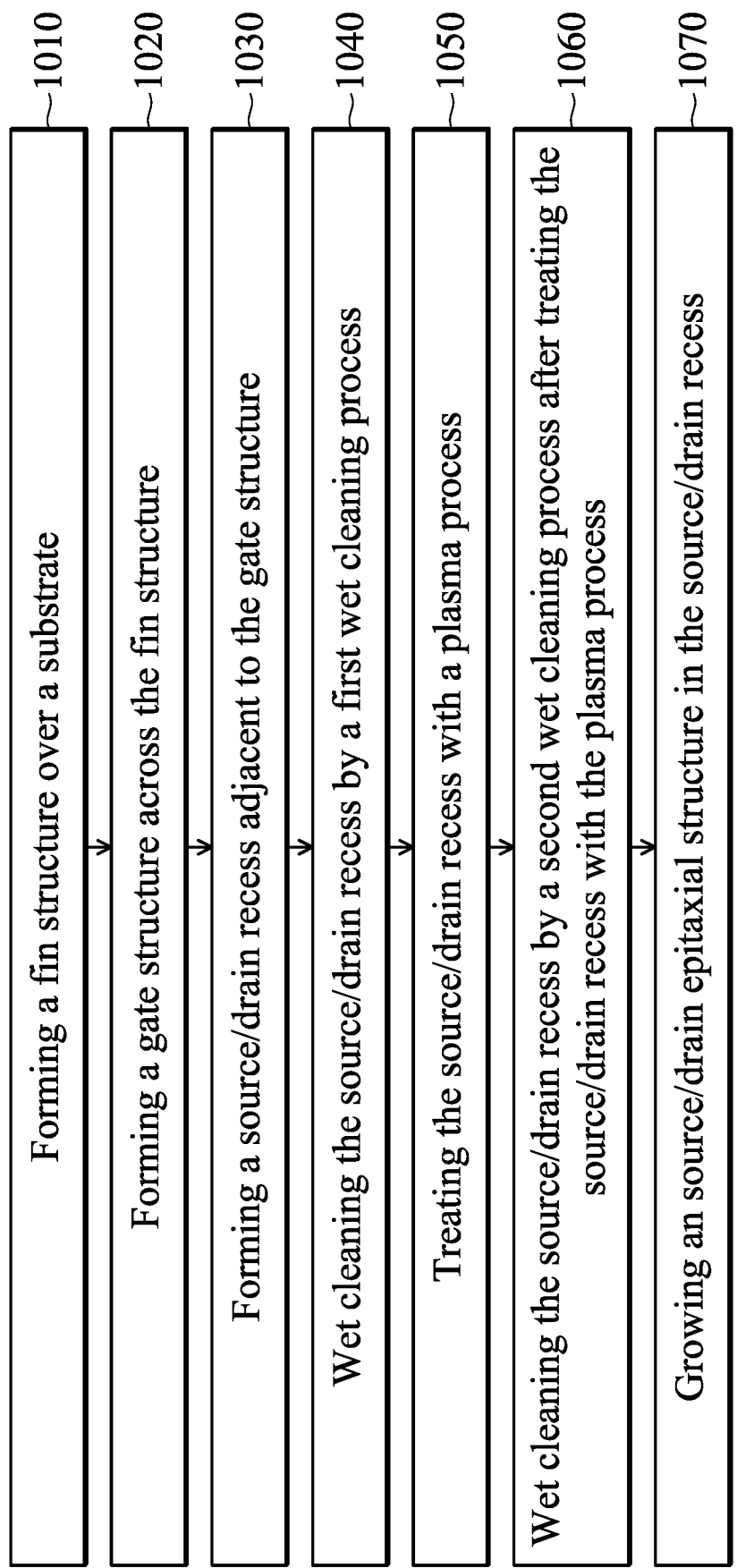
FIG. 3 is a flow chart of forming a FinFET device structure, in accordance with some embodiments of the disclosure.

Next, the width of the source/drain recess 120 is enlarged, as shown in FIG. 2D in accordance with some embodiments. In some embodiments, the width of the bottom portion of the source/drain recess 120 is enlarged. In some embodiments, the width of the source/drain recess 120 is enlarged by sequentially wet cleaning the source/drain recess 120 by a first wet cleaning process, treating the source/drain recess 120 with a plasma process, and then wet cleaning the source/drain recess 120 by a second wet cleaning process.

Referring to FIG. 3, at step 1040, the source/drain recess is wet cleaned in a first wet cleaning process. In some embodiments, the first wet cleaning process is performed by a suitable wet etching etchant such as sulfuric acid. In some embodiments, the first wet cleaning process removes metal residue such as copper, aluminum, iron, or a combination thereof in the fin structure 104 over the surface of the source/drain recess 120. In some embodiments, the spacer 118 is partially removed during the first wet cleaning process. In some embodiments, the profile of the source/drain recess 120 is substantially the same before the first wet cleaning process and after the wet cleaning process.

Referring to FIG. 3, at step 1050, the source/drain recess is treated with a plasma process. In some embodiments, the plasma process is then performed to remove impurities such as carbide, fluoride, or chloride in the fin structure 104. The plasma process may also consume silicon in the fin structure 104. In some embodiments, the plasma process includes a hydrogen radical treatment process. The plasma process may be performed using a gas source including hydrogen. The gas resource may be partially activated into plasma. The charged hydrogen ions may be filtered out and hydrogen radicals may be left entering the working chamber. In the working chamber, the hydrogen radicals may react with the impurities and silicon in the fin structure 104. Therefore, the width of the source/drain recess 120 may be enlarged and the source/drain recess 120 may have an arc-shape surface profile.

In some embodiments, the temperature of the plasma process is in a range of about 250° C. to about 450° C. If the temperature is too low, the reaction between the hydrogen radicals and the impurities in the fin structure 104 may be not enough and the impurities may remain on the surface of the source/drain recess 120. If the temperature is too high, the reaction between the hydrogen radicals and the silicon in the fin structure 104 may be not enough and the width of the source/drain recess 120 may not be enlarged.

In some embodiments, the pressure of the plasma process is in a range of about 0.1 Torr to about 1 Torr. If the pressure is too high, the mean free path between the hydrogen radicals is too short and it may be hard to react with silicon in the fin structure 104. Therefore, the reaction between the hydrogen radicals and the silicon in the fin structure 104 may be too slow. If the pressure is too low, the reaction between the hydrogen radicals and the silicon in the fin structure 104 may be too fast and the loading effect may be worse.

In some embodiments, the duration of the plasma process is in a range of about 10 seconds to about 100 seconds. If the duration is too long, the mean free path between the hydrogen radicals is too short and it may be hard to react with silicon in the fin structure 104. Therefore, the reaction between the hydrogen radicals and the silicon in the fin structure 104 may be too slow. If the duration is too short, the reaction between the hydrogen radicals and the silicon in the fin structure 104 may be too fast and the loading effect may be worse.

In some embodiments, the power of the plasma process is in a range of about 1000 W to about 2500 W. If the power is too high, there may be too many hydrogen radicals bombarding the surface of the source/drain recess 120. Therefore, the surface roughness may be worse. If the power is too low, there may be not enough hydrogen radicals to react with the impurities and silicon in the fin structure 104. Therefore, the impurities may not be removed and the width of the source/drain recess 120 may not be enlarged.

In some embodiments, the flow rate of hydrogen of the plasma process is in a range of about 50 sccm to about 300 sccm. The flow rate of the hydrogen of the plasma process relates to the size of the working chamber. For example, a larger working chamber may need a higher flow rate of hydrogen. For example, a flow rate of hydrogen of the plasma process is about 100 sccm for a 10-liter chamber.

In some embodiments, the spacing between the shower head where the hydrogen radicals enter the working chamber and the FinFET device structure 10a is in a range of about 30 mm to about 200 mm. If the spacing is too short, there may be too many hydrogen radicals bombarding the surface of the source/drain recess 120. Therefore, the surface roughness may be worse. If the spacing is too long, there may be not enough hydrogen radicals to react with the impurities and silicon in the fin structure 104. Therefore, the impurities may not be removed and the width of the source/drain recess 120 may not be enlarged.

The plasma process may not consume the spacer 118. In some embodiments, the width difference of the spacers 118 before the plasma process and after the plasma process is in a range of about 1 Å to about 2 Å. Since the width of the spacers remains, undesired portion of the epitaxial structure may be avoided in subsequently process, and the capacitance may not increase.

Referring to FIG. 3, at step 1060, the source/drain recess is wet cleaned by a second wet cleaning process after treating the source/drain recess with the plasma process. In some embodiments, a native oxide layer is formed over the surface of the source/drain recess 120 (not shown). In some embodiments, the second wet cleaning process is performed by a suitable wet etching etchant such as diluted hydrofluoric acid (dHF). In some embodiments, the wet etching etchant of the first wet cleaning process and the wet etching etchant of the second wet cleaning process are different acids. In some embodiments, the spacer 118 is partially removed during the second wet cleaning process.

In some embodiments, the first wet cleaning process removes oxide including the native oxide layer over the surface of the source/drain recess 120. In some embodiments, after the first wet cleaning process, the second wet cleaning process is performed within a range of about 30 minutes to about 1 hour. Therefore, the native oxide layer may be thin enough and may be completely removed by the second wet cleaning process. If the second wet cleaning process is performed after the plasma process, the native oxide layer grown before the plasma process and the second wet cleaning process may be removed thoroughly. Therefore, the source/drain recess 120 may keep as an arc-shape surface profile, and the device performance may be enhanced.

After sequentially wet cleaning the source/drain recess 120 in a first wet cleaning process, treating the source/drain recess 120 with a plasma process, and then wet cleaning the source/drain recess 120 in a second wet cleaning process, the native oxide layer formed over the surface of the source/drain recess 120 is completely removed, especially the native oxide layer over the bottom portion of the surface of the source/drain recess 120. Therefore, the width of the source/drain recess 120 is enlarged, especially the bottom portion of the source/drain recess 120. Therefore, the width of the bottom portion of the source/drain recess 120 after the second wet cleaning process may be larger than the width of the bottom portion of the source/drain recess 120 before the first wet cleaning process.

In some embodiments, the difference of a depth of the source/drain recess 120 before the first wet cleaning process and after the second wet cleaning process is in a range of about 1 Å to about 5 Å. If the depth of the source/drain recess 120 changes too much, the DIBL (Short channel effect) would be worse. Therefore, the depth of the source/drain recess 120 may be substantially the same while the width of the source/drain recess 120 is enlarged.

In some embodiments, after enlarging the width of the source/drain recess 120, a dry cleaning process is performed. The dry cleaning process may be performed using a suitable etching gas, such as a mixture of ammonia ($NH_3$) and nitrogen trifluoride (NF3), or a mixture of ammonia ($NH_3$) and hydrogen fluoride (HF). The dry cleaning process may further remove the oxide layer over the surface of the source/drain recess 120.

Figure 2E:
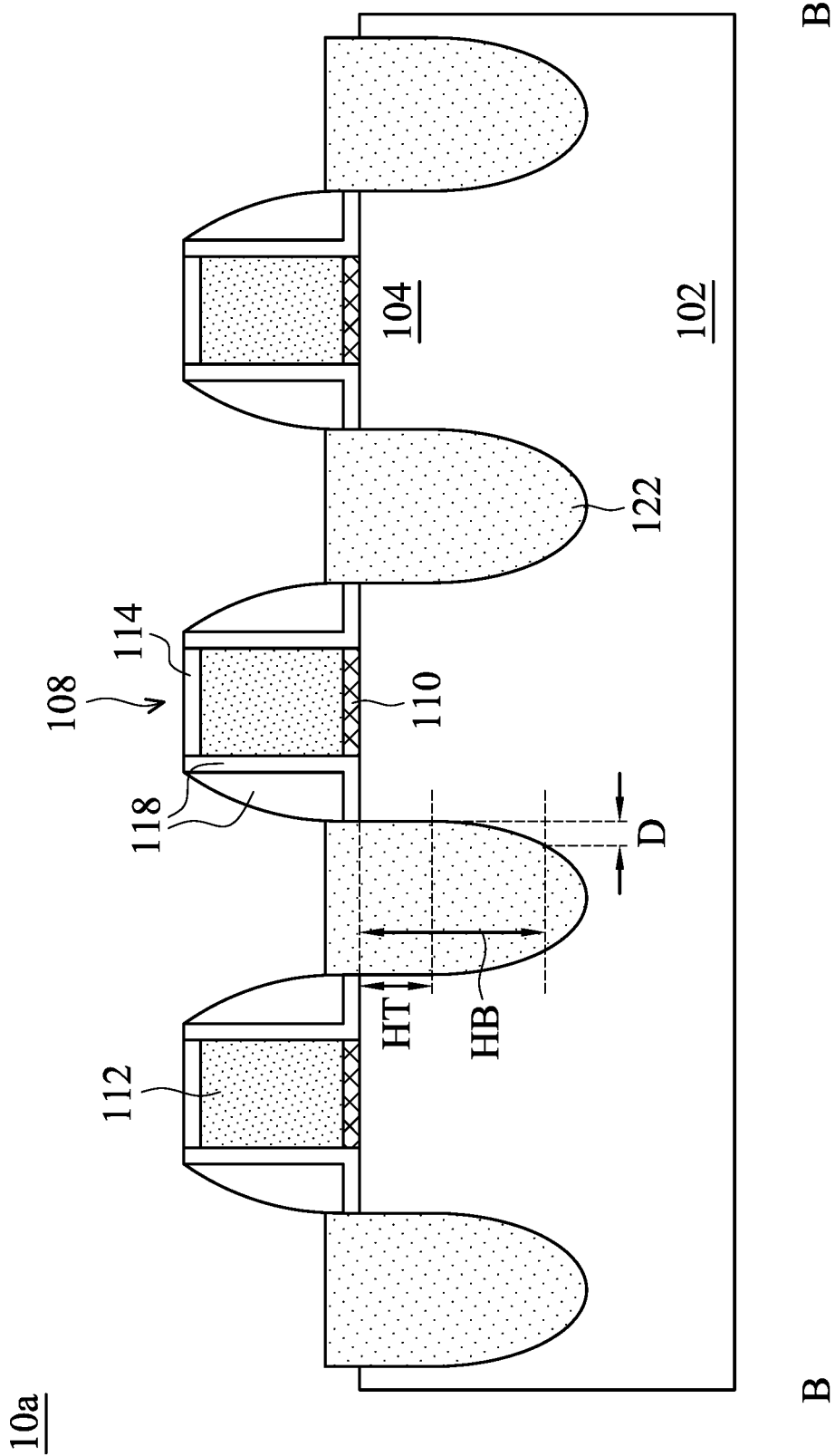

Referring to FIG. 3, at step 1070, the source/drain epitaxial structure in the source/drain recess is grown. Next, a source/drain epitaxial structure 122 is formed in the source/drain recess 120 over the fin structure 104 on opposite sides of the dummy gate structure 108, as shown in FIG. 2E in accordance with some embodiments. A strained material may be grown in the recess by an epitaxial (epi) process to form the source/drain epitaxial structure 122. In addition, the lattice constant of the strained material may be different from the lattice constant of the substrate 102. The source/drain epitaxial structure 122 may include Ge, SiGe, InAs, InGaAs, InSb, GaAs, GaSb, InAlP, InP, SiC, SiP, other applicable materials, or a combination thereof. The source/drain epitaxial structure 122 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable method.

Since the surface of the source/drain recess 120 has been cleaned by sequentially wet cleaning the source/drain recess 120 in a first wet cleaning process, treating the source/drain recess 120 with a plasma process, and then wet cleaning the source/drain recess 120 in a second wet cleaning process, the surface roughness of the source/drain epitaxial structure 122 may be improved. In some embodiments, the root-mean-square (RMS) calculated value of the vertical distance from peak to valley of a surface of the source/drain epitaxial structure 122 is in a range of about 0.15 to about 0.35. In some embodiments, the RMS of a height between a peak and a valley of a surface of the surface of the source/drain epitaxial structure 122 is 0.230. If the RMS of a height between a peak and a valley of a surface of the surface of the source/drain epitaxial structure 122 is too great, the yield may be worse.

As shown in FIG. 2E, the top portion of the source/drain epitaxial structure 122 has a depth HT in a range of about 5 nm to about 20 nm below the top surface of the fin structure 104. The bottom portion of the source/drain epitaxial structure 122 has a depth HB in a range of about 40 nm to about 50 nm below the top surface of the fin structure 104.

In some embodiments as shown in FIG. 2E, the effective current has a maximum value when the difference D of the distance between the source/drain epitaxial structure 122 and the dummy gate structure 108 at the top portion of the source/drain epitaxial structure 122 and the bottom portion of the source/drain epitaxial structure 122 is in a range of about 2 nm to about 3 nm. If the difference D of the distance is too great, the channel resistance may be worse. If the difference D is too small, the Drain-induced barrier lowering (DIBL) may be worse.

In some embodiments as shown in FIG. 2E, the angle θ between the sidewall and the bottom surface of the source/drain epitaxial structure 122 is in a range of about 30° to about 45°. If the angle θ is too great, the channel resistance may be too great. In some embodiments, the angle θ between the sidewall and the bottom surface of the source/drain epitaxial structure 122 has decreased by about 15°. The reduced angle may help to increase strain of the source/drain epitaxial structure 122.

Source/drain epitaxial structure 122 with an arc-shape surface profile may have more fin structure 104 usage and device performance may be improved. Moreover, better source/drain epitaxial structure 122 surface quality may enlarge the yield window of a subsequently formed contact structure landing on the source/drain epitaxial structure 122.

Figure 2F:
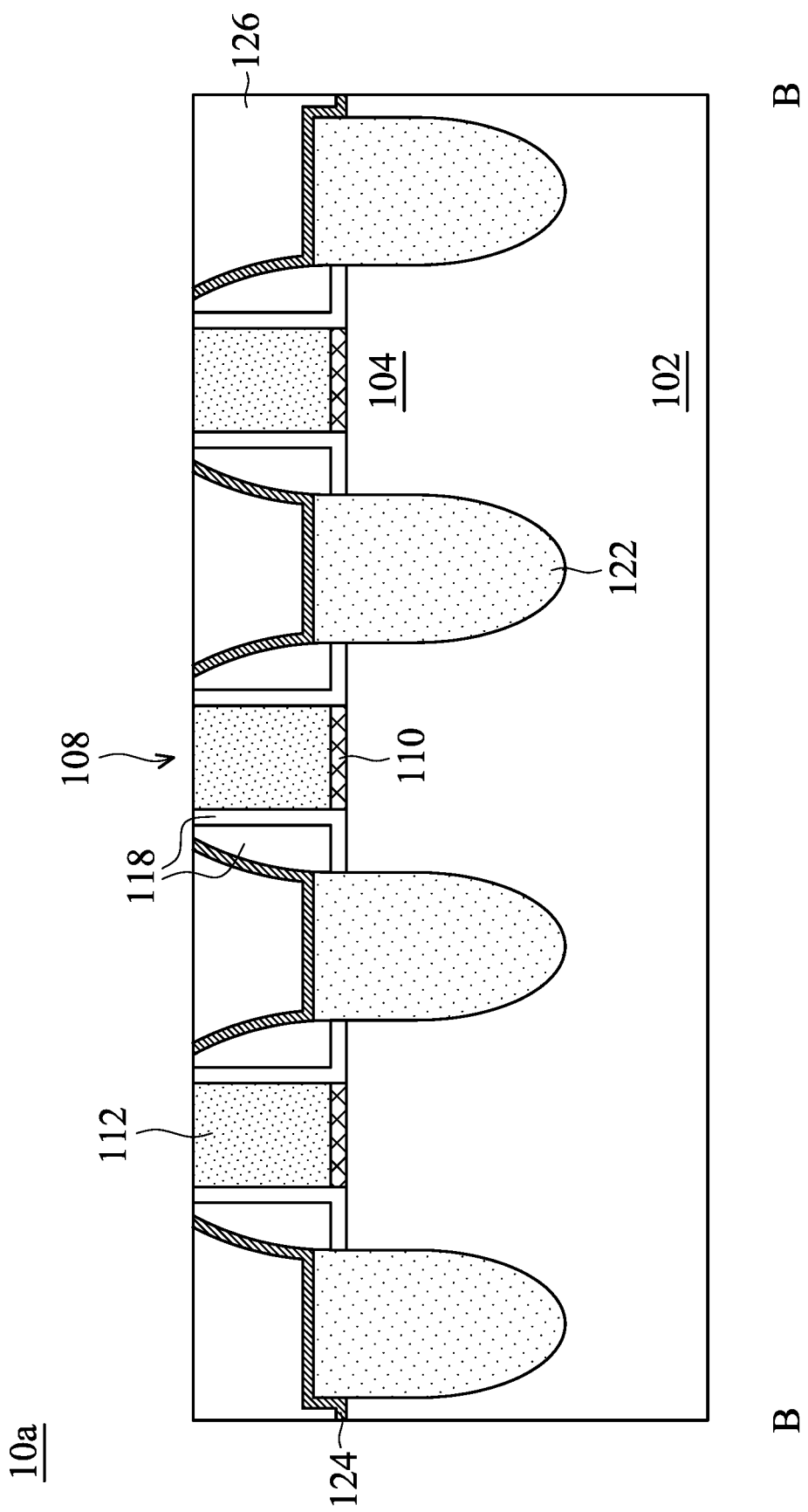

Next, a contact etch stop layer (CESL) 124 is formed over the source/drain epitaxial structure 122 and the dummy gate structure 108, as shown in FIG. 2F in accordance with some embodiments. The CESL 124 includes $SiO_2$, $Si_3N_4$, SiON, $Al_2O_3$, MgO, $Sc_2O_3$, HfO2, HfSiO, HfSiON, HfTaO, HfTiO, HfZrO, LaO, ZrO, $TiO_2$, $ZnO_2$, $ZrO_2$, or $Ta_2O_5$, the like, or a combination thereof. The CESL 124 may be formed by depositing dielectric materials by chemical vapor deposition process (CVD) (such as a plasma enhanced chemical vapor deposition (PECVD) process, a high density plasma chemical vapor deposition (HDPCVD)), an atomic layer deposition (ALD) process, and/or other suitable techniques to deposit dielectric materials.

Afterwards, a first inter-layer dielectric (ILD) structure 126 is formed to cover the source/drain epitaxial structure 122, as shown in FIG. 2F in accordance with some embodiments. In some embodiments, the first ILD structure 126 surrounds the fin structures 104 and the source/drain epitaxial structure 122.

The first ILD structure 126 may include multilayers made of multiple dielectric materials, such as silicon oxide, silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 126 may be formed by chemical vapor deposition (CVD), spin-on coating, or other applicable processes.

Afterwards, a planarizing process is performed on the first ILD structure 126 until the top surface of the dummy gate structure 108 is exposed, as shown in FIG. 2F in accordance with some embodiments. After the planarizing process, the top surface of the dummy gate structure 108 may be substantially level with the top surfaces of the spacers 118 and the first ILD structure 126. The planarizing process may include a grinding process, a chemical mechanical polishing (CMP) process, an etching process, other applicable processes, or a combination thereof.

Next, the dummy gate structure 108, including the dummy gate dielectric layer 110 and the dummy gate electrode layer 112, is removed and a trench is formed between the spacers 118 (not shown). The dummy gate dielectric layer 110 may be an etch stop layer while the dummy gate electrode layer 112 is etched. The dummy gate dielectric layer 110 may then to be removed after removing the dummy gate electrode layer 112.

Figure 2G:
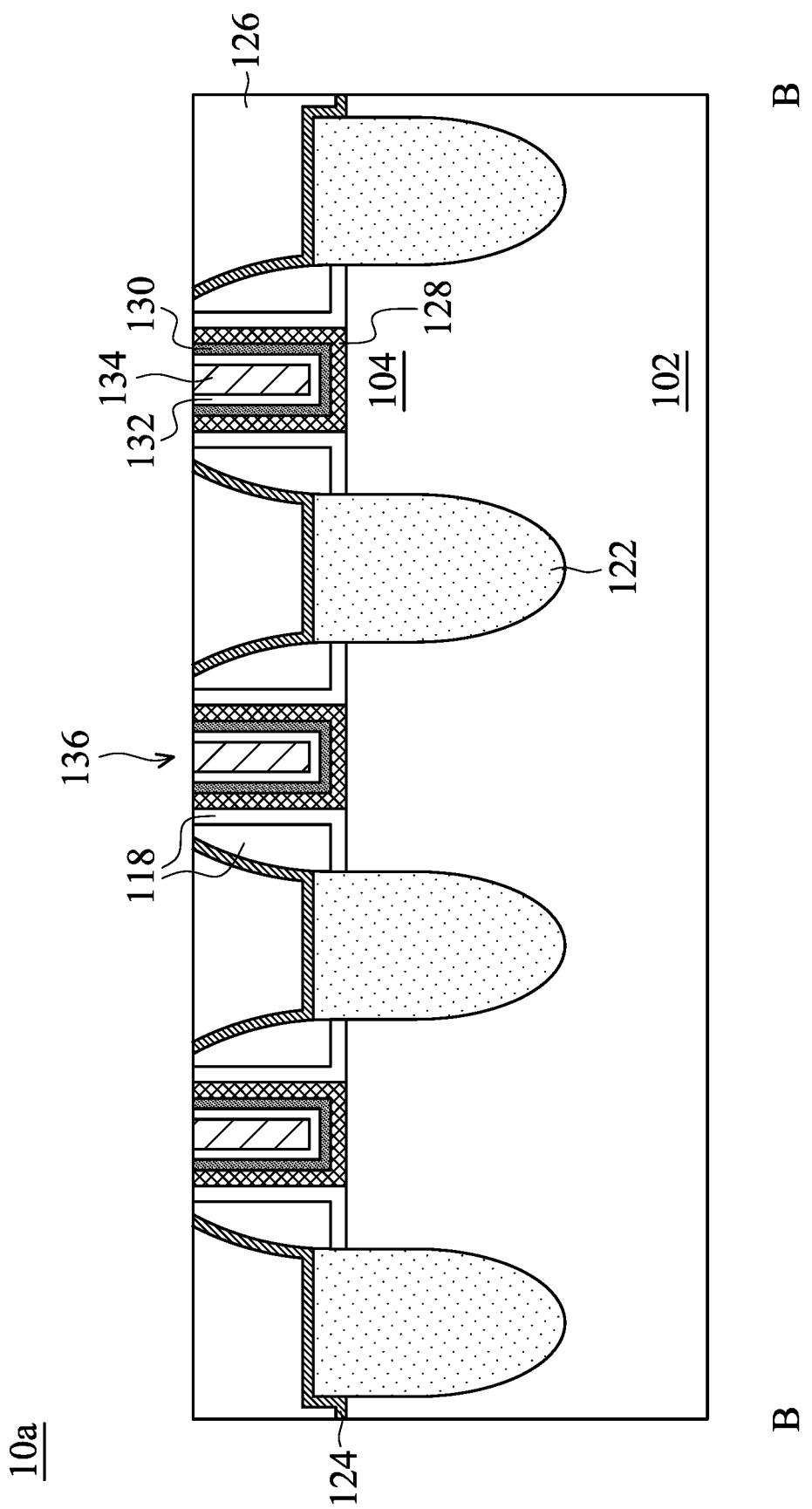

Afterwards, a gate dielectric layer 128, a barrier layer 130, a work function metal layer 132, and a gate electrode layer 134 are conformally formed in the trench between the spacers 118, and a gate structure 136 is formed between the spacers 118, as shown in FIG. 2G in accordance with some embodiments.

The gate dielectric layer 128 may conformally formed over the bottom surface and the sidewalls of the trench between the spacers 118. The gate dielectric layer 128 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 128 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The barrier layer 130 may be conformally formed over the gate dielectric layer 128. The barrier layer 130 may comprise an electrically conductive material such as titanium nitride, tantalum nitride, titanium, tantalum, or a combination thereof. The barrier layer 130 may be formed using a CVD process, such as PECVD, sputtering, metal organic chemical vapor deposition (MOCVD), or ALD, or a combination thereof.

The work function metal layer 132 may be conformally formed over the barrier layer 130. The work function metal layer 132 provides the desired work function for transistors to enhance device performance including improved threshold voltage. The work function metal layer 132 may be made of metal materials, and the metal materials may include N-work-function metal or P-work-function metal. For N-type transistors, N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. For P-type transistors, the P-work-function metal may include titanium nitride (TiN), tungsten nitride (WN), tantalum nitride (TaN), ruthenium (Ru) or a combination thereof.

A seed layer may be formed conformally over the work function metal layer 132 (not shown). The seed layer may include copper, titanium, tantalum, titanium nitride, tantalum nitride, the like, or a combination thereof, and may be deposited by ALD, sputtering, PVD, or the like. The seed layer may be a metal layer, which may be a single layer or a composite layer comprising a plurality of sub-layers formed of different materials. The seed layer may include a titanium layer and a copper layer over the titanium layer.

The gate electrode layer 134 may be formed filling the trench between the spacers 118. The gate electrode layer 134 may be made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. The gate electrode layer 134 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

After conformally forming the gate dielectric layer 128, the barrier layer 130, the work function metal layer 132, and the gate electrode layer 134 in the trench between the spacers 118, a chemical mechanical polishing (CMP) process or an etch back process may be performed to remove excess conductive materials, as shown in FIG. 2G in accordance with some embodiments. As shown in FIG. 2G, the top surfaces of the spacers 118 and the gate structure 136 are exposed.

Figure 2H:
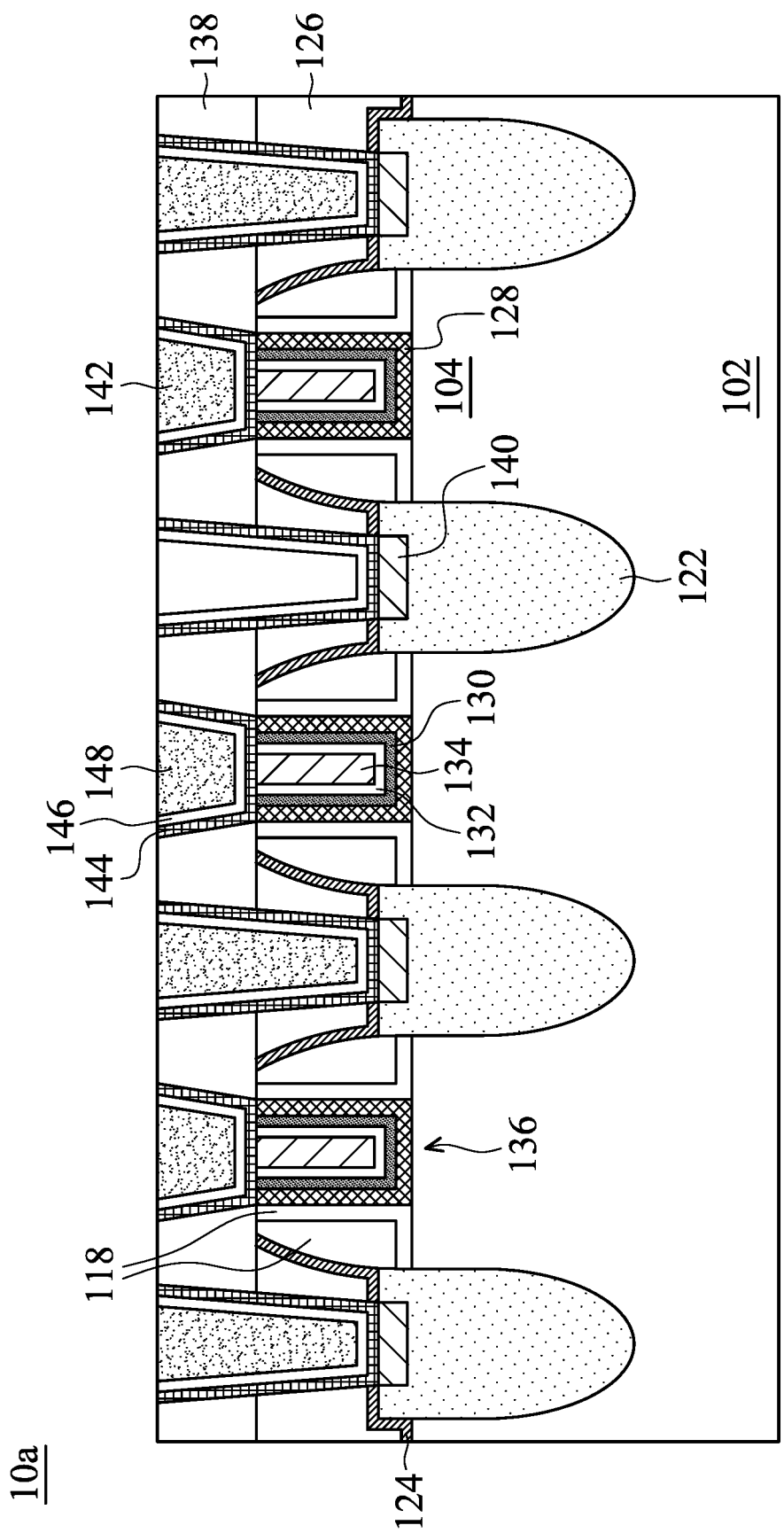

Next, a second ILD structure 138 is formed over first ILD structure 126 and the gate structure 136, as shown in FIG. 2H in accordance with some embodiments. The second ILD structure 138 may be made of SiO-based material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the second ILD structure 138 and the first ILD structure 126 are made of the same material. The second ILD structure 138 may be formed using CVD (such as LPCVD, PECVD, HDP-CVD, HARP, and FCVD), ALD, another suitable method, or a combination thereof.

Next, the first ILD structure 126 and the second ILD structure 138 over the source/drain epitaxial structure 122 may be removed, and a trench may be formed over the source/drain epitaxial structure 122 (not shown). Meanwhile, the second ILD structure 138 over the gate structure 136 may be removed, and a trench may be formed over the gate structure 136 (not shown). The trenches may be formed by an etching process such as a dry etching process or a wet etching process. The source/drain epitaxial structure 122 and the gate structure 136 are exposed from the trenches.

Next, a metal semiconductor compound layer 140 may be formed over the source/drain epitaxial structure 122, as shown in FIG. 2H in accordance with some embodiments. The metal semiconductor compound layer 140 may reduce the contact resistance between the source/drain epitaxial structure 122 and the subsequently formed contact structure over the source/drain epitaxial structure 122. The metal semiconductor compound layer 140 may be made of titanium silicide ($TiSi_2$), nickel silicide (NiSi), cobalt silicide (CoSi), or other suitable low-resistance materials. The semiconductor compound layer may be formed over the source/drain epitaxial structure 122 by forming a metal layer over the source/drain epitaxial structure 122 first. The metal layer may react with the source/drain epitaxial structure 122 by an annealing process and the semiconductor compound layer may be produced. Afterwards, the unreacted metal layer may be removed by an etching process and the metal semiconductor compound layer 140 may be left.

Next, a contact structure 142 is formed in the trench over the source/drain epitaxial structure 122 and the gate structure 136, as shown in FIG. 2H in accordance with some embodiments. The contact structure 142 may include a barrier layer 144, a seed layer 146, and a conductive material 148. The materials and the processes for the barrier layer 144, the seed layer 146, and the conductive material 148 may be the same as or similar to those discussed above for the barrier layer 130, the seed layer, and the gate electrode 134 of the gate structure 136, respectively, and therefore the descriptions of these processes and materials are not repeated herein. The contact structure 142 over the source/drain epitaxial structure 122 and the gate structure 136 may not be in the same cross-section. For simplicity, the contact structure 142 over the source/drain epitaxial structure 122 and the gate structure 136 are shown in the same cross-section view as shown in FIG. 2H.

By sequentially first wet cleaning, plasma treating, and second wet cleaning the source/drain recess 120 may enlarging the width of the source/drain recess 120 and an arc-shape source/drain epitaxial structure 122 profile may be obtained. Therefore, the device performance may be improved. Moreover, the surface quality of the source/drain epitaxial structure 122 may be improved and the yield may be better.

Figure 4:
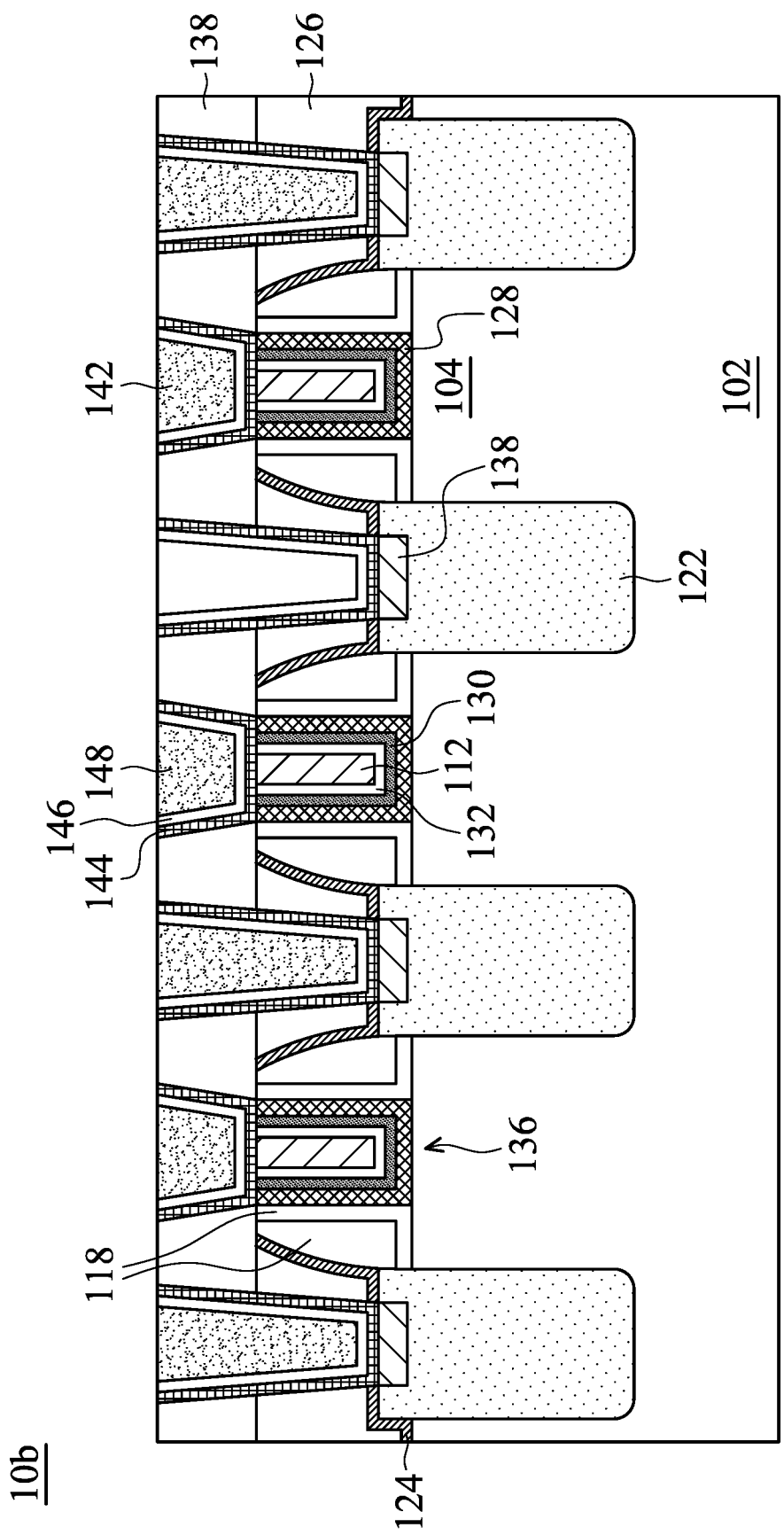
FIG. 4 is a cross-sectional representation of a modified FinFET device structure, in accordance with some embodiments of the disclosure.

Many variations and/or modifications may be made to the embodiments of the disclosure. FIG. 4 is a cross-sectional representation of a FinFET device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the sidewall of the source/drain epitaxial structure 122 is substantially perpendicular to the bottom surface of the source/drain epitaxial structure 122.

In some embodiments, with the second wet cleaning the source/drain recess 120 after the plasma process, the bottom portion of the source/drain recess 120 may be more close to the gate structure 136. Therefore, the device performance may be enhanced. In some embodiments, the power of the plasma process is in a range of about 1000 W to about 3000 W. The operation temperature of the process is in a range about 300 degree C. to 350 degree C. The hydrogen flow is in a range of about 100 sccm to 300 sccm. Therefore, the sidewall of the source/drain epitaxial structure 122 may be substantially perpendicular to the bottom surface of the source/drain epitaxial structure 122.

By sequentially first wet cleaning, plasma treating, and second wet cleaning the source/drain recess 120 may enlarging the width of the source/drain recess 120 and an arc-shape source/drain epitaxial structure 122 profile may be obtained. Therefore, the device performance may be improved. Moreover, the surface quality of the source/drain epitaxial structure 122 may be improved and the yield may be improved. In addition, as the bottom portion of the source/drain epitaxial structure 122 being more close to the gate structure 136, the device performance may be further enhanced.

As described previously, the width of the source/drain recess 120 is enlarged by sequentially first wet cleaning, plasma treating, and second wet cleaning the source/drain recess 120. Since the second wet cleaning is performed after plasma treating the source/drain recess 120, the native oxide layer may be removed thoroughly and the source/drain recess 120 may have an arc-shape profile. Since the source/drain epitaxial structure 122 occupies more fin structure 104, the device performance may be enhanced. Since the surface roughness of the source/drain recess 120 is improved, the yield may be better. In some embodiments as shown in FIG. 4, the sidewall of the source/drain epitaxial structure 122 is substantially perpendicular to the bottom surface of the source/drain epitaxial structure 122, and the device performance is further enhanced.

Embodiments of a method for forming a FinFET device structure are provided. The method for forming the FinFET device structure may include enlarging the width of the source/drain recess by sequentially first wet cleaning, plasma treating, and second wet cleaning the source/drain recess. The source/drain epitaxial structure may have an arc-shape profile and the device performance and the yield may be improved.

In some embodiments, a method for forming a fin field effect transistor device structure is provided. The method for forming a fin field effect transistor device structure includes forming a fin structure over a substrate. The method for forming a fin field effect transistor device structure also includes forming a gate structure across the fin structure. The method for forming a fin field effect transistor device structure also includes forming a source/drain recess adjacent to the gate structure. The method for forming a fin field effect transistor device structure also includes wet cleaning the source/drain recess in a first wet cleaning process. The method for forming a fin field effect transistor device structure also includes treating the source/drain recess with a plasma process. The method for forming a fin field effect transistor device structure also includes wet cleaning the source/drain recess in a second wet cleaning process after treating the source/drain recess with the plasma process. The method for forming a fin field effect transistor device structure also includes growing a source/drain epitaxial structure in the source/drain recess.

In some embodiments, a method for forming a fin field effect transistor device structure is provided. The method for forming a fin field effect transistor device structure includes forming a fin structure over a substrate. The method for forming a fin field effect transistor device structure also includes forming gate structures over the fin structure. The method for forming a fin field effect transistor device structure also includes recessing the fin structure between the gate structures to form a source/drain recess. The method for forming a fin field effect transistor device structure also includes enlarging the width of the source/drain recess by sequentially first wet cleaning, plasma treating, and second wet cleaning the source/drain recess. The method for forming a fin field effect transistor device structure also includes forming a source/drain epitaxial structure in the source/drain recess.

In some embodiments, a method for forming a fin field effect transistor device structure is provided. The method for forming a fin field effect transistor device structure includes forming a gate structure over a fin structure protruding from a substrate. The method for forming a fin field effect transistor device structure also includes removing a portion of the fin structure besides the gate structure to form a source/drain recess. The method for forming a fin field effect transistor device structure also includes wet cleaning the source/drain recess using a first wet etching etchant. The method for forming a fin field effect transistor device structure also includes hydrogen radical treating the source/drain recess. The method for forming a fin field effect transistor device structure also includes wet cleaning the source/drain recess by a second wet etching etchant after hydrogen radical treating the source/drain recess. The method for forming a fin field effect transistor device structure also includes filling an epitaxial material in the source/drain recess to form a source/drain epitaxial structure.

In some embodiments, a method for forming a semiconductor structure is provided. The method for forming a semiconductor structure includes forming a gate structure over a substrate. The method for forming a semiconductor structure also includes forming a spacer on a sidewall of the gate structure. The method for forming a semiconductor structure also includes forming a source/drain recess beside the spacer. The method for forming a semiconductor structure also includes treating the source/drain recess and partially removing the spacers in a first cleaning process. The method for forming a semiconductor structure also includes treating the source/drain recess with a plasma process after performing the first cleaning process. The method for forming a semiconductor structure also includes treating the source/drain recess in a second cleaning process after treating the source/drain recess with the plasma process. The method for forming a semiconductor structure also includes forming a source/drain structure in the source/drain recess after performing the second cleaning process.

In some embodiments, a method for forming a semiconductor structure is provided. The method for forming a semiconductor structure includes forming gate structures over a fin structure. The method for forming a semiconductor structure also includes forming spacers over opposite sides of the gate structure. The method for forming a semiconductor structure also includes recessing the fin structure to form a source/drain recess. The method for forming a semiconductor structure also includes forming a native oxide layer over the source/drain recess. The method for forming a semiconductor structure also includes enlarging a width of the source/drain recess by sequentially performing a first wet cleaning, plasma treating, and second wet cleaning the source/drain recess. The method for forming a semiconductor structure also includes partially removing the spacers.

In some embodiments, a method for forming a semiconductor structure is provided. The method for forming a semiconductor structure includes forming a gate structure over a fin structure. The method for forming a semiconductor structure also includes forming spacers beside the gate structure. The method for forming a semiconductor structure also includes forming a source/drain recess in the fin structure. The method for forming a semiconductor structure also includes first wet cleaning the source/drain recess. The method for forming a semiconductor structure also includes hydrogen radical treating the source/drain recess. The method for forming a semiconductor structure also includes second wet cleaning the source/drain recess and the spacers. The method for forming a semiconductor structure also includes forming a source/drain epitaxial structure in the source/drain recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a gate structure over a substrate;
   forming a spacer on a sidewall of the gate structure;
   forming a source/drain recess beside the spacer;
   treating the source/drain recess and partially removing the spacer in a first cleaning process, wherein the first cleaning process removes metal residue;
   treating the source/drain recess with a plasma process after performing the first cleaning process;
   treating the source/drain recess in a second cleaning process after treating the source/drain recess with the plasma process, wherein the first cleaning process and the second cleaning process use different etchants; and
   forming a source/drain structure in the source/drain recess after performing the second cleaning process.

2. The method for forming the semiconductor structure as claimed in claim 1, wherein a width of the source/drain recess is enlarged after the first cleaning process, the plasma process, and the second cleaning process.

3. The method for forming the semiconductor structure as claimed in claim 1, wherein the metal residue includes copper, aluminum, iron, or a combination thereof.

4. The method for forming the semiconductor structure as claimed in claim 1, wherein the plasma process comprises a hydrogen radical treatment process, wherein hydrogen radicals react with impurities and silicon.

5. The method for forming the semiconductor structure as claimed in claim 4, wherein the impurities comprise carbide, fluoride, or chloride.

6. The method for forming the semiconductor structure as claimed in claim 1, wherein a duration of the plasma process is in a range of about 10 seconds to about 100 seconds.

7. The method for forming the semiconductor structure as claimed in claim 1, wherein a width of the spacer remains after the plasma process.

8. A method for forming a semiconductor structure, comprising:
   forming gate structures over a fin structure;
   forming spacers over opposite sides of the gate structures;
   recessing the fin structure to form a source/drain recess;
   forming a native oxide layer over the source/drain recess;
   enlarging a width of the source/drain recess by sequentially performing a first wet cleaning, plasma treating, and second wet cleaning the source/drain recess, wherein the plasma treating consumes silicon in the fin structure; and
   partially removing the spacers.

9. The method for forming the semiconductor structure as claimed in claim 8, further comprising:
   removing the native oxide layer.

10. The method for forming the semiconductor structure as claimed in claim 8, wherein the native oxide layer is removed by the first wet cleaning and the second wet cleaning.

11. The method for forming the semiconductor structure as claimed in claim 8, further comprising:
    dry cleaning the source/drain recess,
    wherein the native oxide layer is removed by the dry cleaning.

12. The method for forming the semiconductor structure as claimed in claim 8, wherein the native oxide layer is formed over a bottom portion of a surface of the source/drain recess.

13. The method for forming the semiconductor structure as claimed in claim 8, wherein a temperature of the plasma treating is in a range of about 250° C. to about 450° C.

14. The method for forming the semiconductor structure as claimed in claim 11, wherein the dry cleaning is performed after the second wet cleaning.

15. A method for forming a semiconductor structure, comprising:
    forming a gate structure over a fin structure;
    forming spacers beside the gate structure;
    forming a source/drain recess in the fin structure;
    first wet cleaning the source/drain recess;
    hydrogen radical treating the source/drain recess;
    second wet cleaning the source/drain recess and the spacers, wherein a second wet etching etchant used in the second wet cleaning is different from a first wet etching etchant used in the first wet cleaning; and
    forming a source/drain epitaxial structure in the source/drain recess.

16. The method for forming the semiconductor structure as claimed in claim 15, wherein the first wet etching etchant is sulfuric acid, and the second wet etching etchant is diluted hydrofluoric acid (dHF).

17. The method for forming the semiconductor structure as claimed in claim 15, wherein the source/drain recess has an arc-shape surface profile after hydrogen radical treating the source/drain recess.

18. The method for forming the semiconductor structure as claimed in claim 15, wherein a power of the hydrogen radical treating is in a range of about 1000 W to about 2500 W.

19. The method for forming the semiconductor structure as claimed in claim 15, wherein a width of the source/drain recess is enlarged after hydrogen radical treating the source/drain recess.

20. The method for forming the semiconductor structure as claimed in claim 15, wherein a pressure of the hydrogen radical treating is in a range of about 0.1 Torr to about 1 Torr.

* * * * *